US012771369B2

(12) United States Patent
Venkateswaran et al.

(10) Patent No.: US 12,771,369 B2
(45) Date of Patent: Oct. 20, 2026

(54) ONLINE COMMON-MODE VOLTAGE ADJUSTMENT FOR SINGLE-ENDED ANALOG INTERFACE IN A WIRELESS DEVICE

(71) Applicant: QUALCOMM Incorporated, San Diego, CA (US)

(72) Inventors: Madhav Venkateswaran, Hyderabad (IN); Saishankar Katri Pulliyakode, Hyderabad (IN); Sharad Kumar, Hyderabad (IN); Kiran Kumar Kakarla, Hyderabad (IN); Sreenivasa Mallia, Bangalore (IN); Mohamed Jabir, Alappuzha (IN); Honghao Ji, San Diego, CA (US); Mahim Ranjan, San Diego, CA (US); Saranyan Nagarajan, Hyderabad (IN)

(73) Assignee: Qualcomm Incorporated, San Diego, CA (US)

( * ) Notice: Subject to any disclaimer, the term of this patent is extended or adjusted under 35 U.S.C. 154(b) by 143 days.

(21) Appl. No.: 18/795,632

(22) Filed: Aug. 6, 2024

(65) Prior Publication Data

US 2026/0045956 A1 Feb. 12, 2026

(51) Int. Cl.
*H03M 1/12* (2006.01)
*H03M 1/46* (2006.01)

(52) U.S. Cl.
CPC ......... *H03M 1/1245* (2013.01); *H03M 1/462* (2013.01)

(58) Field of Classification Search
CPC ............................ H03M 1/462; H03M 1/1245
See application file for complete search history.

(56) References Cited

U.S. PATENT DOCUMENTS

| | | | | |
|---|---|---|---|---|
| 7,720,141 | B2 | 5/2010 | Fang et al. | |
| 7,978,112 | B2 * | 7/2011 | Terranova | H03M 1/0604 341/120 |
| 9,240,912 | B1 * | 1/2016 | Giridharan | H03F 3/45659 |
| 10,594,308 | B1 * | 3/2020 | Sun | H03M 1/0607 |

(Continued)

FOREIGN PATENT DOCUMENTS

EP 2932596 B1 1/2019

OTHER PUBLICATIONS

International Search Report and Written Opinion—PCT/US2025/039945—ISA/EPO—Dec. 8, 2025.

*Primary Examiner* — Lam T Mai
(74) *Attorney, Agent, or Firm* — Gerald P. Joyce, III

(57) ABSTRACT

Methods and apparatus for online common-mode voltage adjustment for a single-ended analog interface, such as in a wireless device. An example circuit for wireless communications includes a first integrated circuit and a second integrated circuit, each including different portions of a receive path. The portion of the receive path of the second integrated circuit is configured to receive, from the first integrated circuit, an analog signal including a first common-mode voltage signal, determine an estimate of the first common-mode voltage signal during an online operation of the receive path, and process the common-mode voltage signal during the online operation to generate a second common-mode voltage signal for the portion of the receive path of the second integrated circuit, based at least in part on the estimate of the first common-mode voltage signal.

20 Claims, 7 Drawing Sheets

(56) References Cited

U.S. PATENT DOCUMENTS

| | | | | |
|---|---|---|---|---|
| 2007/0132625 | A1* | 6/2007 | Chen | H03M 1/0607 341/155 |
| 2013/0201041 | A1* | 8/2013 | Roze | H03M 9/00 341/100 |
| 2014/0085122 | A1* | 3/2014 | Jeon | H03M 1/0678 341/158 |
| 2014/0247170 | A1* | 9/2014 | Nagarajan | G06F 1/3296 341/155 |
| 2015/0194981 | A1* | 7/2015 | Tang | H03M 1/0609 341/172 |
| 2015/0349733 | A1* | 12/2015 | Chen | H03F 3/45475 330/258 |
| 2016/0056837 | A1* | 2/2016 | Allen | H03K 19/017509 327/333 |
| 2017/0026051 | A1* | 1/2017 | Lee | H03F 3/45941 |
| 2020/0021303 | A1* | 1/2020 | Seo | H03F 3/45632 |

* cited by examiner

ONLINE COMMON-MODE VOLTAGE ADJUSTMENT FOR SINGLE-ENDED ANALOG INTERFACE IN A WIRELESS DEVICE

TECHNICAL FIELD

Certain aspects of the present disclosure generally relate to electronic circuits and, more particularly, to techniques and apparatus for online common-mode voltage adjustment for a single-ended analog interface, such as in a wireless device.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a modulator/demodulator (modem) integrated circuit (IC) coupled to a radio frequency integrated circuit (RFIC) via an analog interface.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled “Detailed Description,” one will understand how the features of this disclosure provide the advantages described herein.

Certain aspects of the present disclosure can be implemented in a circuit for wireless communications. The circuit includes a first integrated circuit and a second integrated circuit. The first integrated circuit includes a first output and a first portion of a first receive path. The first portion is configured to generate a first analog signal including a first common-mode voltage signal and to provide the first analog signal to the first output. The second integrated circuit includes a first input coupled to the first output and configured to receive the first analog signal from the first output, and a second portion of the first receive path. The second portion is configured to receive the first analog signal comprising the first common-mode voltage signal from the first input, determine a first estimate of the first common-mode voltage signal during an online operation of the first receive path, and process the first common-mode voltage signal during the online operation to generate a second common-mode voltage signal for the second portion of the first receive path, based at least in part on the first estimate of the first common-mode voltage signal.

Certain aspects of the present disclosure can be implemented in a method of common-mode voltage adjustment for a single-ended analog interface in a wireless device. The method generally includes receiving an analog signal comprising a first common-mode voltage signal, the analog signal being received from a first integrated circuit including a first portion of a receive path by a second integrated circuit including a second portion of the receive path. The method also includes determining, via the second portion of the receive path, an estimate of the first common-mode voltage signal during an online operation of the receive path. The method further includes processing, via the second portion of the receive path, the first common-mode voltage signal during the online operation to generate a second common-mode voltage signal for the second portion of the receive path, based at least in part on the estimate of the first common-mode voltage signal.

Certain aspects of the present disclosure can be implemented in a wireless device. The wireless device includes at least one antenna and a circuit for wireless communications coupled to the at least one antenna. The circuit includes a first integrated circuit and a second integrated circuit. The first integrated circuit includes a first portion of a receive path, the first portion being configured to generate an analog signal including a first common-mode voltage signal and to provide the analog signal to an output of the first integrated circuit. The second integrated circuit includes an input coupled to the output of the first integrated circuit and configured to receive the analog signal from the output, and a second portion of the receive path. The second portion is configured to receive the analog signal including the first common-mode voltage signal from the input, determine an estimate of the first common-mode voltage signal during an online operation of the receive path, and process the first common-mode voltage signal during the online operation to generate a second common-mode voltage signal for the second portion of the receive path, based at least in part on the estimate of the first common-mode voltage signal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
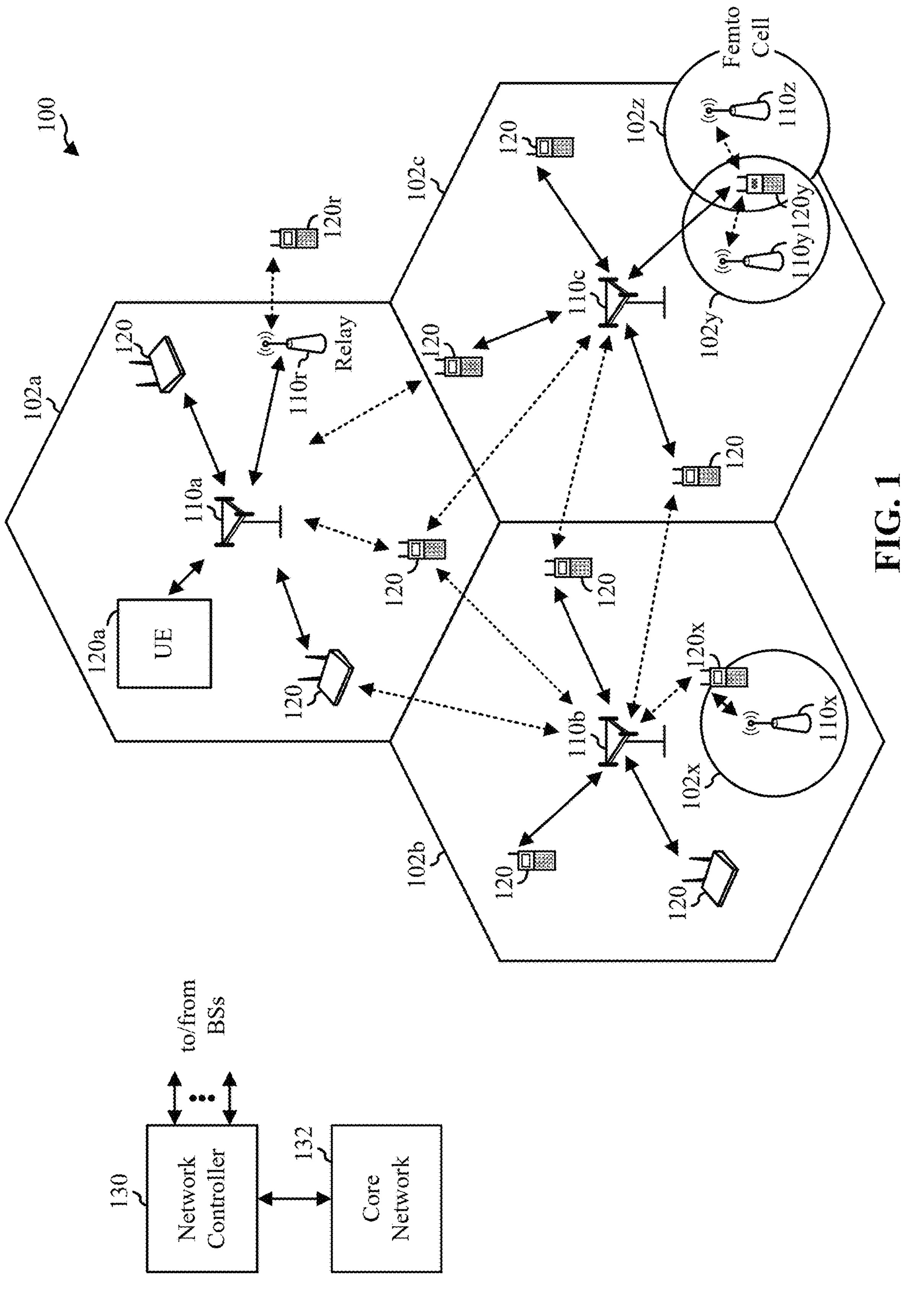
FIG. 1 is a diagram of an example wireless communications network, in which aspects of the present disclosure may be practiced.

Certain aspects of the present disclosure relate to techniques and apparatus for online common-mode voltage adjustment for a single-ended analog interface, such as between a modem and a radio frequency front-end (RFFE)/radio frequency upconversion module/radio frequency downconversion module in a wireless communications device.

Certain wireless communications devices may include a wireless transceiver circuit that is implemented on two or more integrated circuits (ICs). For example, the wireless transceiver circuit may include one or more receive chains (or receive paths), where each receive chain is separated onto two different ICs between a baseband filter (BBF) and an analog-to-digital converter (ADC), with an interface therebetween. For instance, the ADC may be included in a modulator/demodulator (modem) IC, while the BBF (and other components) of the receive chain(s) may be included in a radio frequency integrated circuit (RFIC).

In certain cases, the interface between the RFIC and modem IC may be implemented as a differential interface. With a differential interface, any common-mode voltage (Vcm) present on the differential signal pair traversing the interface may be canceled. Ideally, Vcm from the analog output of (the baseband filter on) the RFIC should be canceled before being input to the ADC to avoid loss of dynamic range due to the Vcm.

In other certain cases, the interface between the RFIC and modem IC may be implemented as a single-ended interface. Compared to a differential interface, a single-ended interface may help save area by reducing the number of pins or balls on each of the two ICs and/or may reduce complexity of routing on a printed circuit board (PCB) between the two ICs. However, one challenge with implementing a single-ended interface between the two ICs is that it is more challenging to effectively cancel Vcm on the interface signal of a single-ended architecture. While factory calibration may be performed to cancel out Vcm on a single-ended interface, this Vcm compensation setting may not be valid with changes in power supply loads and/or device temperature. Ideally, Vcm compensation should be effective across power supply load variations and temperature to maximize, or at least increase, the usable dynamic range of the ADC, preferably in an online mode (or online operation) while a wireless device with the ICs is being used and receiving wireless signals.

As such, certain aspects described herein provide techniques and apparatus for implementing Vcm adjustment in a single-ended architecture in a wireless device. In certain aspects described herein, the techniques for implementing Vcm adjustment in the single-ended architecture may be performed during online operation of the wireless device (e.g., while the wireless device is being used and receiving wireless signals). As described below, the Vcm adjustment techniques described herein may involve online estimation of the common-mode voltage difference between the RFIC and the modem, and applying a fine voltage correction (or at least adjustment), based on the estimated delta in common-mode voltage, so that the delta is effectively canceled (or at least reduced) during the online operation.

The techniques and apparatus for implementing Vcm adjustment in a single-ended architecture in a wireless device during online operation may provide various technical advantages. For example, the Vcm adjustment techniques herein may effectively cancel the Vcm on the interface signal of the single-ended architecture during the online operation, such that the Vcm compensation is effective across power supply load variations and temperature of various system components (e.g., power supply, transistor, and/or resistor variations across temperature and process/technologies), maximizing (or least increasing) the usable dynamic range of the ADC under various operating scenarios.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, a hyphenated form of a reference numeral refers to a specific instance of an element and the unhyphenated form of the reference numeral refers to the collective element. Thus, for example, device "12-1" refers to an instance of a device class, which may be referred to collectively as devices "12" and any one of which may be referred to generically as a device "12."

Although the terms "first," "second," "third," etc., may be used herein to describe various devices, circuits, elements, components, regions, layers and/or sections, these devices, circuits, elements, components, regions, layers and/or sections should not be limited by these terms. These terms may be only used to distinguish one device, circuit, element, component, region, layer or section from another device, circuit, element, component, region, layer, or section. Terms such as "first," "second," and other numerical terms, when used herein, do not imply a sequence or order unless clearly indicated by the context. Thus, a first device, circuit, element, component, region, layer, or section discussed herein could be termed a second device, circuit, element, component, region, layer, or section without departing from aspects of the present disclosure.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an Institute of Electrical and Electronics Engineers (IEEE) standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may implement a common-mode voltage (Vcm) adjustment scheme for a single-ended analog interface, as described in more detail herein.

Figure 2:
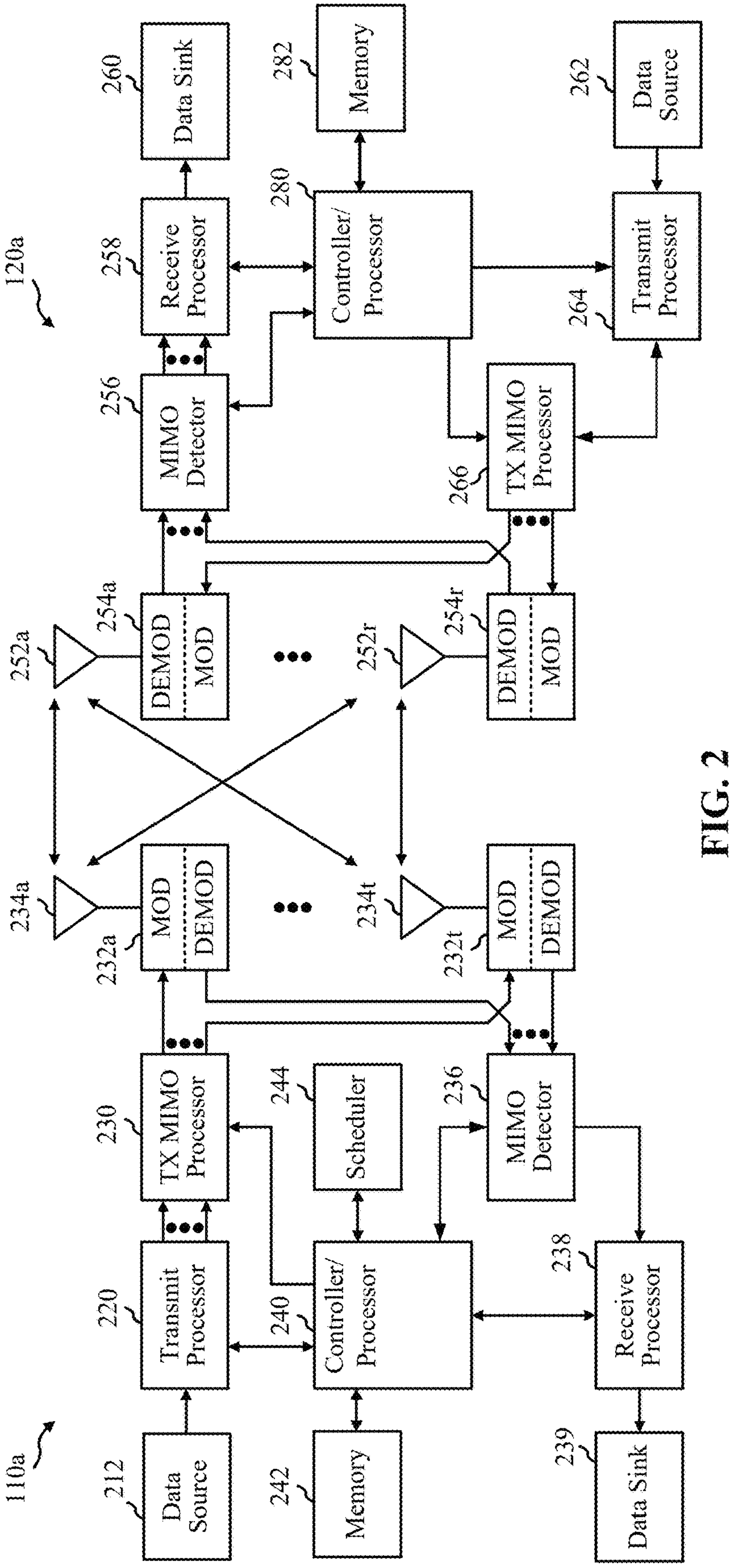
FIG. 2 is a block diagram conceptually illustrating a design of an example a base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110*a* may be used to perform the various techniques and methods described herein.

In certain aspects of the present disclosure, the transceivers 232 and/or the transceivers 254 may implement a common-mode voltage adjustment scheme for a single-ended analog interface, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
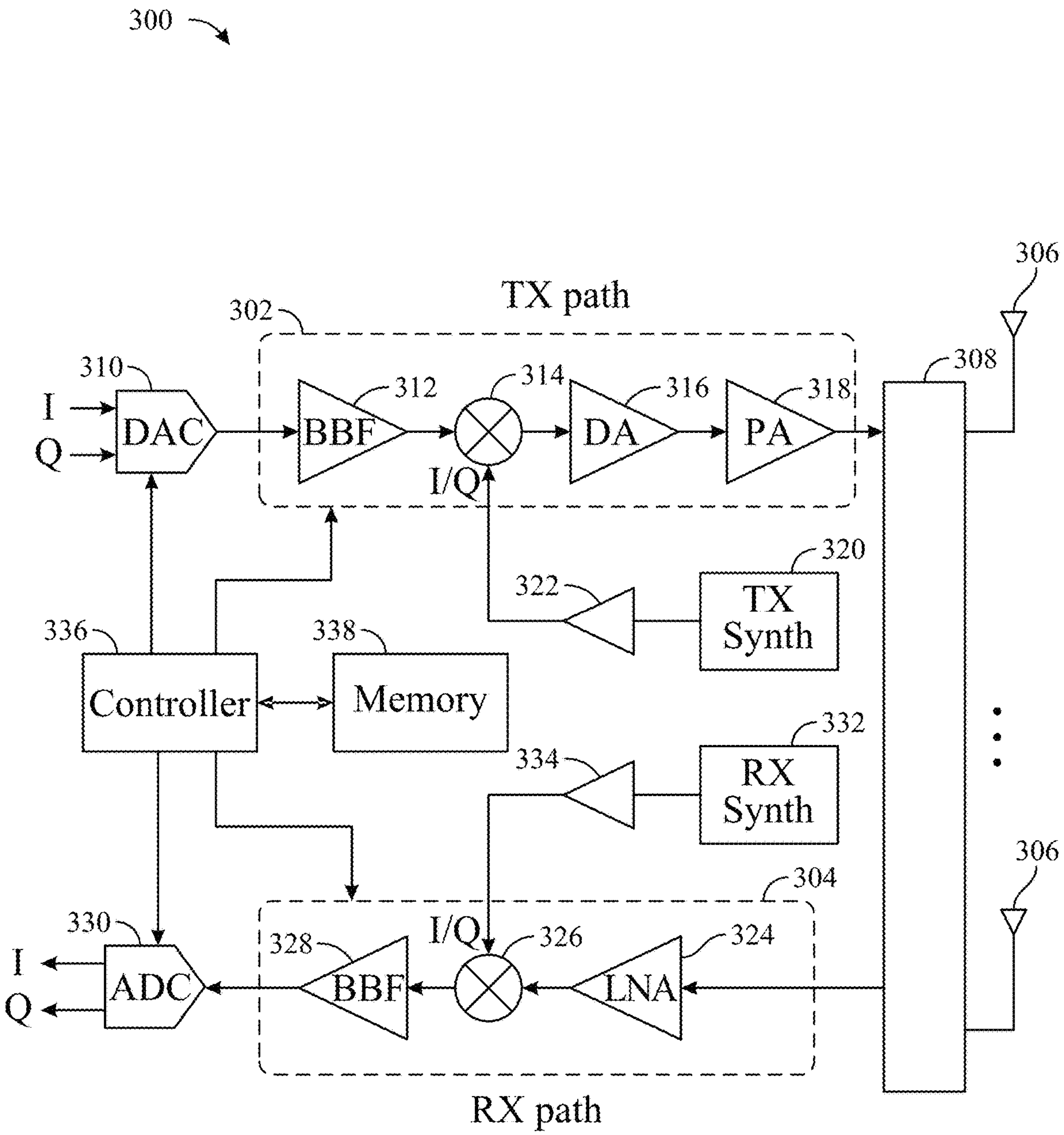
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Example Common-Mode Voltage Adjustment

As noted, in certain cases, a wireless transceiver circuit (e.g., the RF transceiver circuit 300 of FIG. 3) may be implemented on two or more ICs. For example, the wireless transceiver circuit may include one or more receive chains (e.g., the RX path(s) 304), where each receive chain is separated onto two different ICs between a BBF (e.g., the BBF 328) and an ADC (e.g., the ADC 330), with an interface therebetween. This interface may be implemented as a differential interface or as single-ended interface. The ADC may be included in a modem IC, while other components of the RX chain may be included in an RFIC.

Figure 4A:
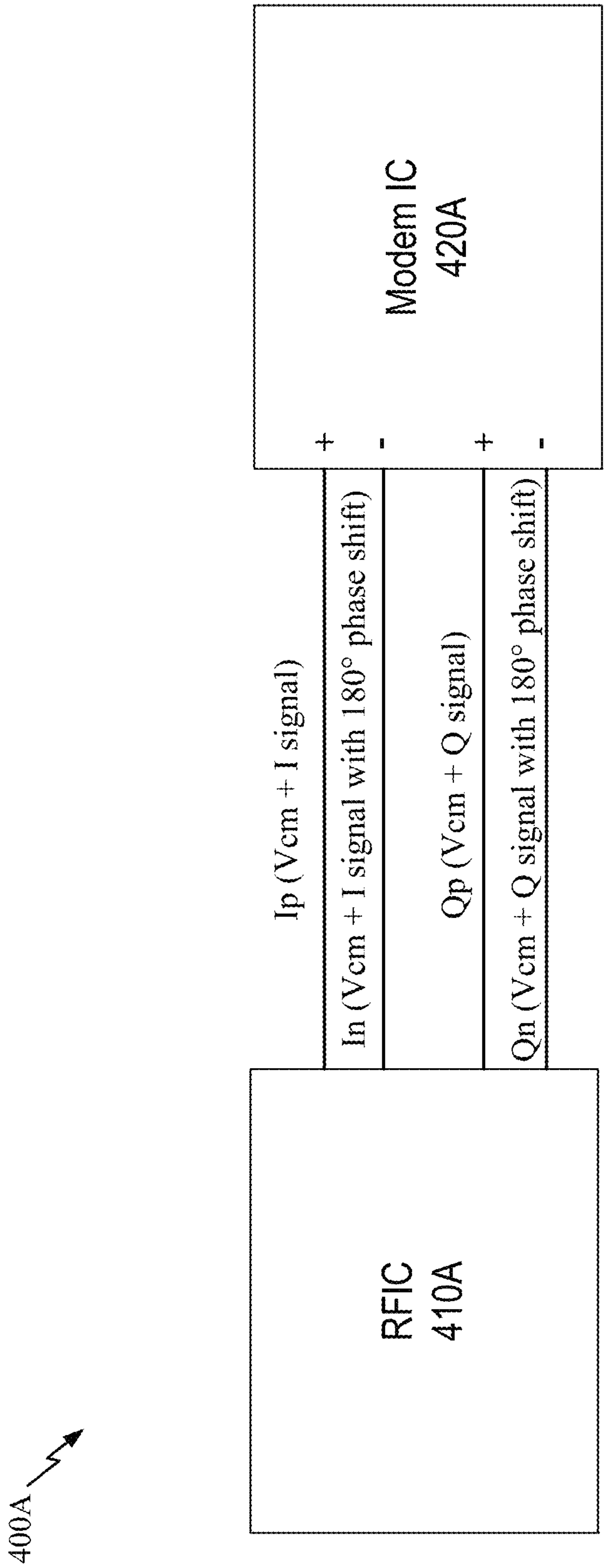
FIG. 4A is a block diagram illustrating common-mode voltage cancellation in a differential architecture.

FIG. 4A is a block diagram 400A illustrating Vcm cancellation in a differential architecture, where the RFIC 410A is coupled to the modem IC 420A with a differential interface. With such a differential interface, any Vcm present on the differential signal pair (Ip/In) and/or the differential signal pair (Qp/Qn) traversing the interface will be canceled. Ideally, Vcm from the analog output of (the BBF on) the RFIC 410A should be canceled before being input to the ADC (within modem IC 420A) to avoid loss of dynamic range due to the Vcm.

As noted, compared to the differential interface depicted in FIG. 4A, a single-ended interface may help save area by reducing the number of pins or balls on each of the RFIC 410A and modem IC 420A. However, one challenge with implementing a single-ended interface between the RFIC 410A and modem IC 420A is that it is more challenging to effectively cancel Vcm on the interface signal of a single-ended architecture. While factory calibration may be performed to cancel out Vcm on a single-ended interface, this Vcm compensation setting may not be valid with changes in power supply loads and device temperature. Ideally, Vcm compensation should be effective across power supply load variations and temperature to maximize, or at least increase, the usable dynamic range of the ADC, preferably in an online mode (or online operation) while a wireless device with the ICs is being used and receiving wireless signals.

Example Online Common-Mode Voltage Adjustment for Single-Ended Analog Interface in a Wireless Device Certain aspects described herein provide techniques and apparatus for implementing online Vcm adjustment in a single-ended architecture in a wireless device. For example, the Vcm adjustment in the single-ended architecture may be performed during online operation of a transceiver (e.g., the RF transceiver circuit 300 of FIG. 3) (e.g., while the transceiver is being used and receiving wireless signals). As described below, the Vcm adjustment techniques described herein may involve online estimation of the Vcm difference (or delta) between the RFIC and the modem, and applying a fine voltage correction (or at least adjustment), based on the estimated delta in Vcm, so that the delta is effectively canceled (or at least reduced) during the online operation.

The techniques and apparatus for implementing Vcm adjustment in a single-ended architecture in a wireless device during online operation may provide various technical advantages. For example, the Vcm adjustment techniques herein may effectively cancel the Vcm on the interface signal of the single-ended architecture during the online operation, such that the Vcm compensation is effective across power supply load variations and temperature of various system components (e.g., power supply, transistor, and/or resistor variations across temperature and process/technologies), maximizing (or least increasing) the usable dynamic range of the ADC under various operating scenarios.

Figure 4B:
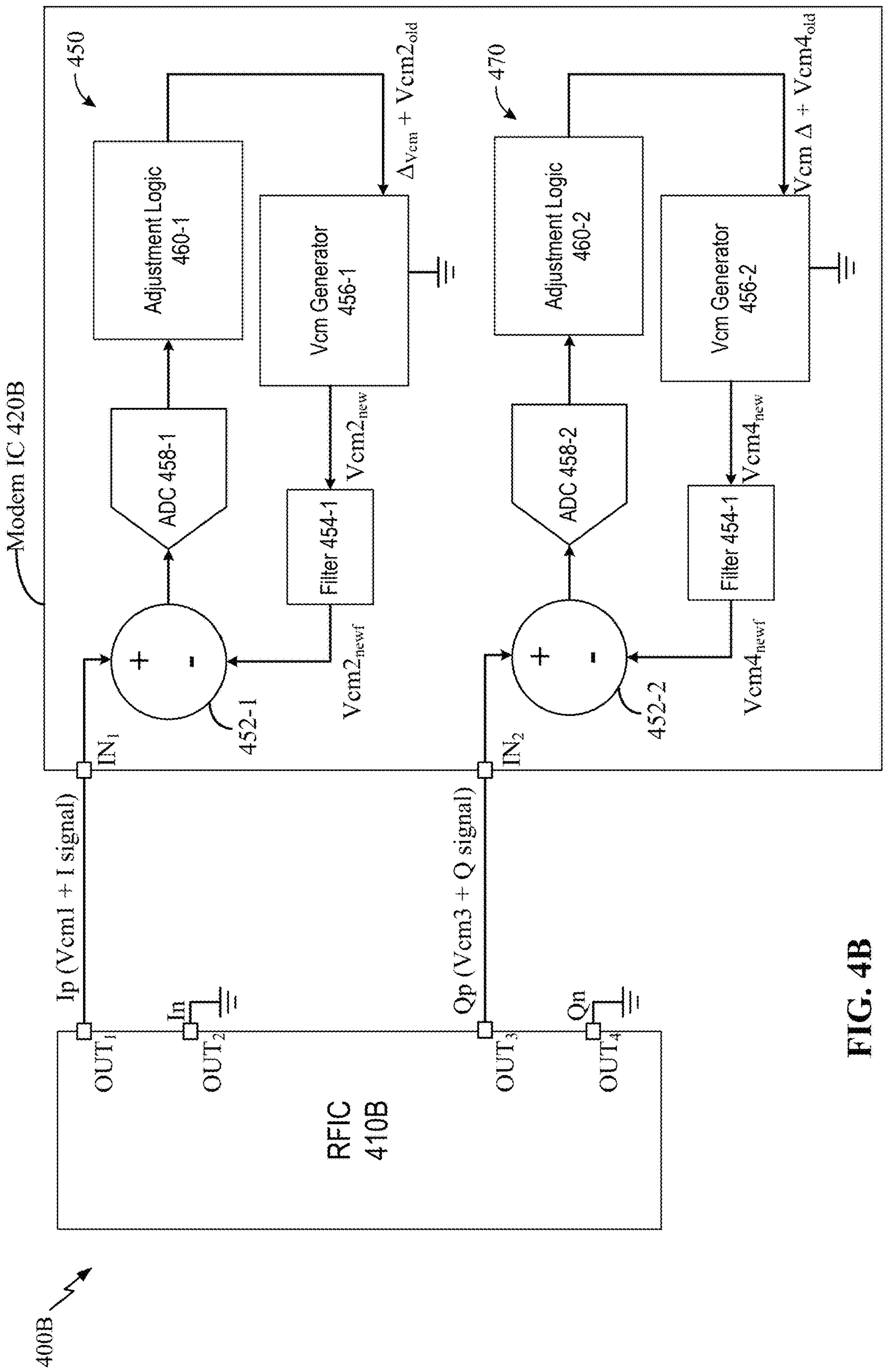
FIG. 4B is a block diagram illustrating common-mode voltage cancellation in a single-ended architecture, in accordance with certain aspects of the present disclosure.

FIG. 4B is a block diagram 400B illustrating Vcm adjustment in a single-ended architecture, where the RFIC 410B is coupled to the modem IC 420B with a single-ended interface. As shown, the Ip line coupled between output ($OUT_1$) of RFIC 410B and input ($IN_1$) of modem IC 420B carries a common-mode signal (Vcm1) and an I analog signal (e.g., I baseband analog signal), the In line from output ($OUT_2$) of RFIC 410B is coupled to a reference potential node (e.g., electrical ground, virtual ground, or any other terminating impedance for improved impedance matching to achieve a target baseband performance metric(s)), the Qp line coupled between output ($OUT_3$) of RFIC 410B and input ($IN_2$) of modem IC 420B carries a common-mode signal (Vcm3) and a Q analog signal (e.g., Q baseband analog signal), and the Qn line from output ($OUT_4$) of RFIC 410B is coupled to the reference potential node (e.g., electrical ground, virtual ground, or any other terminating impedance for improved impedance matching to achieve a target baseband performance metric(s)).

In FIG. 4B, the RFIC 410B may include a first portion of a first receive chain (e.g., first portion of a RX chain 304-1) and the modem IC 420B may include a second portion 450 of the first receive chain (e.g., second portion of the RX chain 304-1).

The second portion 450 of the first receive chain implemented on the modem IC 420B may include, without limitation, a combiner circuit 452-1, an ADC 458-1, adjustment logic 460-1, a Vcm generator 456-1, and a filter 454-1. In certain aspects, the second portion 450 may be configured to perform Vcm adjustment to effectively cancel the Vcm (e.g., Vcm1) on the Ip line of the single-ended architecture during online operation, such that the Vcm adjustment is effective across power supply load variations and temperature of various system components (e.g., power supply, transistor, and/or resistor variations across temperature and process/technologies), maximizing (or least increasing) the usable dynamic range of the ADC 458-1 under various operating scenarios.

In certain aspects, the adjustment logic 460-1 may be configured to perform an online estimation of the Vcm difference between the RFIC 410B and the modem IC 420B. For example, to perform the online estimation, the adjustment logic 460-1 may obtain multiple samples of a Vcm difference between the RFIC 410B and the modem IC 420B over a time window during the online operation. The time window may be a preconfigured time window, such as 1 second, 2 seconds, or some other amount of time.

The adjustment logic 460-1 may perform a filtering operation on the multiple Vcm difference samples to determine a filtered value of the Vcm difference over the time window. In certain aspects, the filtered value of the Vcm difference may be a filtered and time-averaged value of the Vcm difference over the time window. In an illustrative example, the filtering operation may include using an infinite impulse response (IIR) filter to determine a filtered and time-averaged value of the Vcm difference over the time window. Such an IIR filter may smooth out high frequency run-to-run variation and allow the adjustment logic 460-1 to converge to a steady state value for the Vcm difference. That is, in certain aspects, the filtered and time-averaged value of the Vcm difference may remove occurrences of sudden spiking and/or oscillation within the samples.

The adjustment logic 460-1 may determine a Vcm adjustment, based on the filtered value of the Vcm difference and pass an indication of the Vcm adjustment to the Vcm generator 456-1. In certain aspects, the Vcm adjustment may have the following representation:

$$V\text{cm adjustment} = \Delta_{Vcm} + V\text{cm}2_{old} \quad (1)$$

where $\Delta_{V\ cm}$ is the filtered value of the Vcm difference between the RFIC 410B and the modem IC 420B and $\text{Vcm2}_{old}$ is a reference estimate of the common-mode signal (Vcm1). In certain aspects, $\text{Vcm2}_{old}$ may be a preconfigured estimate of the common-mode signal (Vcm1) (e.g., determined prior to online operation) or a prior estimate of the common-mode signal (Vcm1) (e.g., determined during a prior time window or an average of a series of prior time windows during online operation).

In aspects where $\text{Vcm2}_{old}$ is a preconfigured estimate of the common-mode signal (Vcm1), this preconfigured estimate may be used during an initial one or more time windows during the online operation. For example, $\text{Vcm2}_{old}$ may be an approximate estimate of the common-mode signal (Vcm1) determined based on a char seed value or determined during factory calibration of the wireless device. The adjustment logic 460-1 may update $\text{Vcm2}_{old}$ for a subsequent time window by setting $\text{Vcm2}_{old}=\Delta_{Vcm}+\text{Vcm2}_{old}$.

In certain aspects, the Vcm generator 456-1 is configured to generate a common-mode signal ($\text{Vcm2}_{new}$) based on the indication of the Vcm adjustment obtained from the adjustment logic 460-1, where $\text{Vcm2}_{new}=\text{Vcm adjustment}=\Delta_{Vcm}+\text{Vcm2}_{old}$. Additionally or alternatively, in certain aspects, the Vcm generator 456-1 may generate the common-mode signal ($\text{Vcm2}_{new}$) based on a digital code, which may be based on an initial median value across parts or based on a one-time device-specific offline calibration. In some cases, the Vcm generator 456-1 may be implemented with a voltage divider (e.g., a resistor voltage divider). In other cases, the Vcm generator 456-1 may be implemented using a bandgap based architecture (e.g., a bandgap voltage reference circuit).

The common-mode signal ($\text{Vcm2}_{new}$) may be provided to the filter 454-1 (e.g., low pass filter (LPF)), which may generate a filtered common-mode signal ($\text{Vcm2}_{newf}$) and provide the filtered common-mode signal ($\text{Vcm2}_{newf}$) to the combiner circuit 452-1. The combiner circuit 452-1 may apply the filtered common-mode signal ($\text{Vcm2}_{newf}$) to the common-mode signal (Vcm1) received via input ($IN_1$) of the modem IC 420B. For example, the combiner circuit 452-1 may subtract the filtered common-mode signal ($\text{Vcm2}_{newf}$) from the common-mode signal (Vcm1), so that the Vcm difference between the RFIC 410B and modem IC 420B is effectively canceled (or at least reduced) during the online operation, prior to the I analog signal (e.g., I baseband analog signal) being input into the ADC 458-1. That is, the combiner circuit 452-1 may output a processed I analog signal having little to no Vcm, and pass the processed I analog signal (having little to no Vcm) to the input of the ADC 458-1. In this manner, the techniques described herein can maximize (or at least increase) the usable dynamic range of the ADC 458-1 under various operating scenarios.

In FIG. 4B, the RFIC 410B may also include a first portion of a second receive chain (e.g., first portion of a RX chain 304-2) and the modem IC 420B may include a second portion 470 of the second receive chain (e.g., second portion of the RX chain 304-2).

The second portion 470 of the second receive chain implemented on the modem IC 420B may include, without limitation, a combiner circuit 452-2, an ADC 458-2, adjustment logic 460-2, a Vcm generator 456-2, and a filter 454-2. In certain aspects, the second portion 470 may be configured to perform Vcm adjustment to effectively cancel the Vcm (e.g., Vcm3) on the Qp line of the single-ended architecture during online operation, such that the Vcm adjustment is effective across power supply load variations and temperature of various system components (e.g., power supply, transistor, and/or resistor variations across temperature and process/technologies), maximizing (or least increasing) the usable dynamic range of the ADC 458-2 under various operating scenarios.

In certain aspects, the adjustment logic 460-2 may be configured to perform an online estimation of the Vcm difference between the RFIC 410B and the modem IC 420B. For example, to perform the online estimation, the adjustment logic 460-2 may obtain multiple samples of a Vcm difference between the RFIC 410B and the modem IC 420B over a time window during the online operation. The time window may be a preconfigured time window, such as 1 second, 2 seconds, or some other amount of time.

The adjustment logic 460-2 may perform a filtering operation on the multiple Vcm difference samples to determine a filtered value of the Vcm difference over the time window. In certain aspects, the filtered value of the Vcm difference may be a filtered and time-averaged value of the Vcm difference over the time window. In an illustrative example, the filtering operation may include using an IIR filter to determine a filtered and time-averaged value of the Vcm difference over the time window. Such an IIR filter may smooth out high frequency run-to-run variation and allow the adjustment logic 460-2 to converge to a steady state value for the Vcm difference. That is, in certain aspects, the filtered and time-averaged value of the Vcm difference may remove occurrences of sudden spiking and/or oscillation within the samples.

The adjustment logic 460-2 may determine a Vcm adjustment, based on the filtered value of the Vcm difference and pass an indication of the Vcm adjustment to the Vcm generator 456-2. In certain aspects, the Vcm adjustment may have the following representation:

$$V\text{cm adjustment} = \Delta_{Vcm} + V\text{cm}4_{old} \quad (2)$$

where $\Delta_{Vcm}$ is the filtered value of the Vcm difference between the RFIC 410B and the modem IC 420B and $\text{Vcm}4_{old}$ is a reference estimate of the common-mode signal (Vcm3). In certain aspects, $\text{Vcm}4_{old}$ may be a preconfigured estimate of the common-mode signal (Vcm3) (e.g., determined prior to online operation) or a prior estimate of the common-mode signal (Vcm3) (e.g., determined during a prior time window or an average of a series of prior time windows during online operation).

In aspects where $\text{Vcm}4_{old}$ is a preconfigured estimate of the common-mode signal (Vcm3), this preconfigured estimate may be used during an initial one or more time windows during the online operation. For example, $\text{Vcm}4_{old}$ may be an approximate estimate of the common-mode signal (Vcm3) determined based on a char seed value or determined during factory calibration of the wireless device. The adjustment logic 460-2 may update $\text{Vcm}4_{old}$ for a subsequent time window by setting $\text{Vcm}4_{old}=\Delta_{Vcm}+\text{Vcm}4_{old}$.

In certain aspects, the Vcm generator 456-2 is configured to generate a common-mode signal ($\text{Vcm}4_{new}$) based on the indication of the Vcm adjustment obtained from the adjustment logic 460-2, where $\text{Vcm}4_{new}=\text{Vcm adjustment}=\Delta_{Vcm}+\text{Vcm}3_{old}$. Additionally or alternatively, in certain aspects, the Vcm generator 456-2 may generate the common-mode signal ($\text{Vcm}4_{new}$) based on a digital code, which may be based on an initial median value across parts or based on a one-time device-specific offline calibration. In some cases, the Vcm generator 456-2 may be implemented with a voltage divider (e.g., a resistor voltage divider). In other cases, the Vcm generator 456-2 may be implemented using a bandgap-based architecture (e.g., a bandgap voltage reference circuit).

The common-mode signal ($\text{Vcm}4_{new}$) may be provided to the filter 454-2 (e.g., LPF), which may generate a filtered common-mode signal ($\text{Vcm}4_{newf}$) and provide the filtered common-mode signal ($\text{Vcm}4_{newf}$) to the combiner circuit 452-2. The combiner circuit 452-2 may apply the filtered common-mode signal ($\text{Vcm}4_{newf}$) to the common-mode signal (Vcm3) received via input ($IN_2$) of the modem IC 420B. For example, the combiner circuit 452-2 may subtract the filtered common-mode signal ($\text{Vcm}4_{newf}$) from the common-mode signal (Vcm3), so that the Vcm difference between the RFIC 410B and modem IC 420B is effectively canceled (or at least reduced) during the online operation, prior to the Q analog signal (e.g., Q baseband analog signal) being input into the ADC 458-2. That is, the combiner circuit 452-2 may output a processed Q analog signal having little to no Vcm, and pass the processed Q analog signal (having little to no Vcm) to the input of the ADC 458-2. In this manner, the techniques described herein can maximize (or at least increase) the usable dynamic range of the ADC 458-2 under various operating scenarios.

Note that Vcm adjustment depicted in FIG. 4B is an illustrative example of Vcm adjustment in a single-ended architecture and that other implementations of Vcm adjustment in single-ended architectures consistent with the functionality described herein are contemplated. For example, while FIG. 4B depicts the modem IC with two adjustment logics 460-1 to 460-2 and two Vcm generators 456-1 to 456-2, in certain aspects, the techniques described herein for Vcm adjustment in a single-ended architecture may be implemented using a single adjustment logic 460 and/or a single Vcm generator 456. Similarly, while FIG. 4B depicts independently estimating the Vcm delta for the I path and Q path and applying the Vcm adjustments to the I path and Q path independently, in certain aspects, the Vcm adjustment may involve averaging the Vcm delta for the I path and the Vcm delta for the Q path, and applying a common offset voltage for both I and Q paths. In yet other aspects, the Vcm adjustment may involve measuring the Vcm delta for the I path and the Vcm delta for the Q path, averaging the measurements, and then performing filtering (e.g., as opposed to filtering and then averaging).

Figure 5:
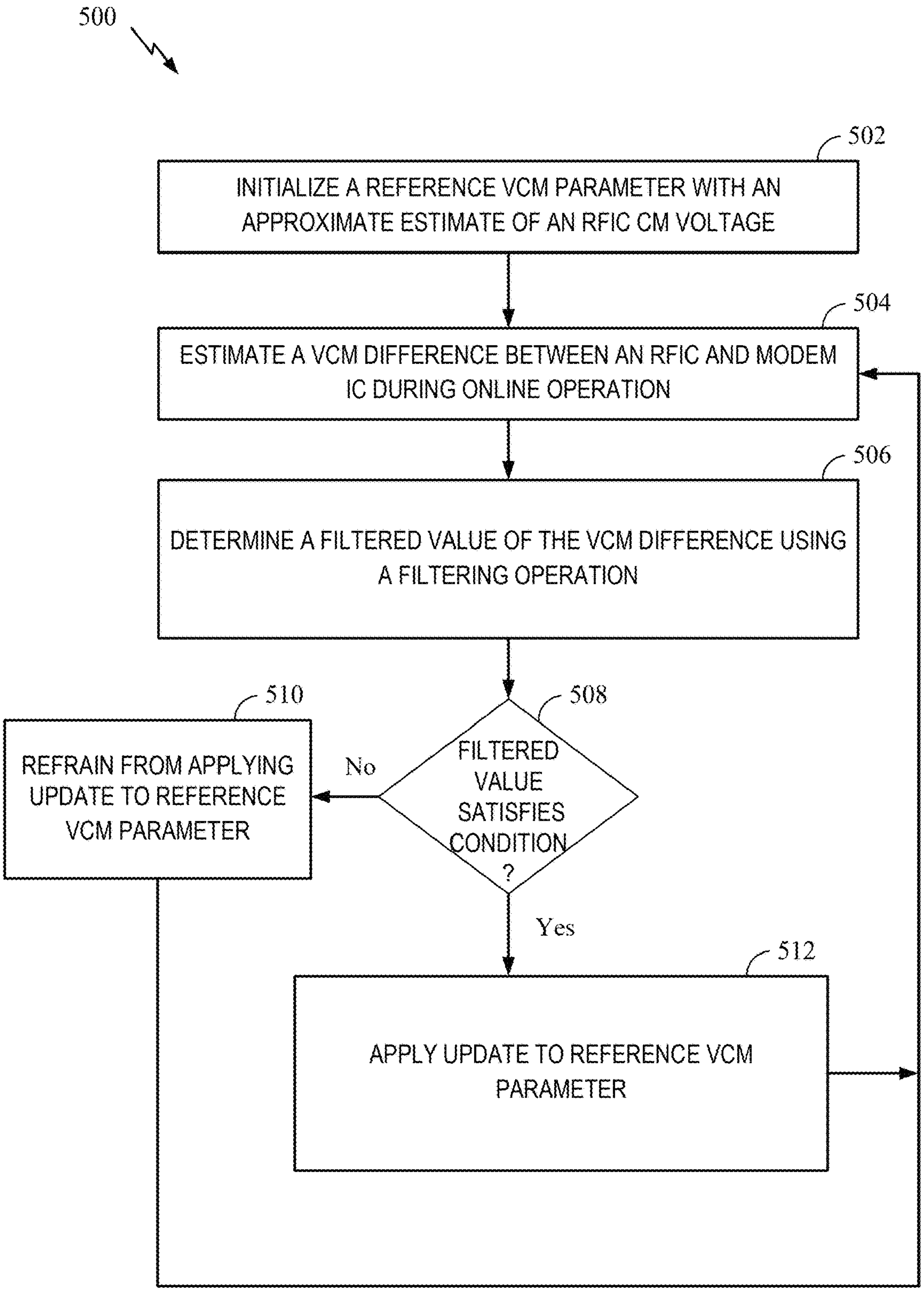
FIG. 5 is a flow diagram of an example common-mode voltage adjustment process applying a common-mode voltage correction update, in accordance with certain aspects of the present disclosure.

FIG. 5 is a flow diagram of an example Vcm adjustment process 500 applying the fine common-mode voltage adjustment of FIG. 4B, in accordance with certain aspects of the present disclosure. The Vcm adjustment process 500 may be implemented by a portion of a receive chain (e.g., RX path 304) on a modem IC (e.g., modem IC 420B).

At block 502, the Vcm adjustment process 500 may involve initializing a reference Vcm parameter (e.g., Vcm2old or Vcm4old) with an approximate estimate of a common-mode voltage (e.g., Vcm1 or Vcm3) from an RFIC (e.g., the RFIC 410B). In some cases, the initialization may be based on a char seed value or based on a preconfigured value determined from factory calibration of the wireless device.

At block 504, the Vcm adjustment process 500 may further involve estimating a difference in Vcm (e.g., $\Delta_{VCM}$) between the RFIC and the modem IC. For example, estimating the Vcm difference may include obtaining multiple samples of the Vcm difference over a time window during online operation of the receive chain (e.g., while the receive chain is being used and receiving analog signals).

At block 506, the Vcm adjustment process 500 may further involve determining a filtered value of the Vem difference using a filtering operation (e.g., IIR filter to smooth out high frequency run-to-run variation to converge to a steady state value).

At block 508, the Vcm adjustment process 500 may further involve determining whether the filtered value of the Vem difference satisfies a predetermined condition (e.g., the filtered value of the Vem difference is greater than (or equal to) a threshold). If the filtered value of the Vem difference does not satisfy the predetermined condition (e.g., the filtered value of the Vem difference is less than (or equal to) a threshold), then the Vcm adjustment process 500 proceeds to block 510. On the other hand, if the filtered value of the Vcm difference does satisfy the predetermined condition (e.g., the filtered value of the Vem difference is greater than (or equal to) a threshold), then the Vcm adjustment process 500 proceeds to block 512.

At block 510, the Vem adjustment process 500 may further involve refraining from applying an update to the reference Vem parameter (e.g., $Vcm2_{old}$ or $Vcm4_{old}$). At block 512, the Vcm adjustment process 500 may further involve applying an update to the reference Vcm parameter, based on the filtered value of the Vcm difference (e.g., $Vcm2_{old}$=Vcm difference+$Vcm2_{old}$ or $Vcm4_{old}$=Vcm difference+$Vcm4_{old}$), such that the usable dynamic range of an ADC (e.g., ADC 458-1 or ADC 485-2) is maximized (or at least increased) under various operating scenarios.

Note, although not shown in FIG. 5, in certain aspects, the Vcm adjustment process 500 may further involve resetting the reference Vcm parameter to an initial value (e.g., the initialization step in block 502) upon determining that each of a predetermined number of filtered values of the Vem difference corresponding to a predetermined number of time windows is below a threshold.

Example Operations

Figure 6:
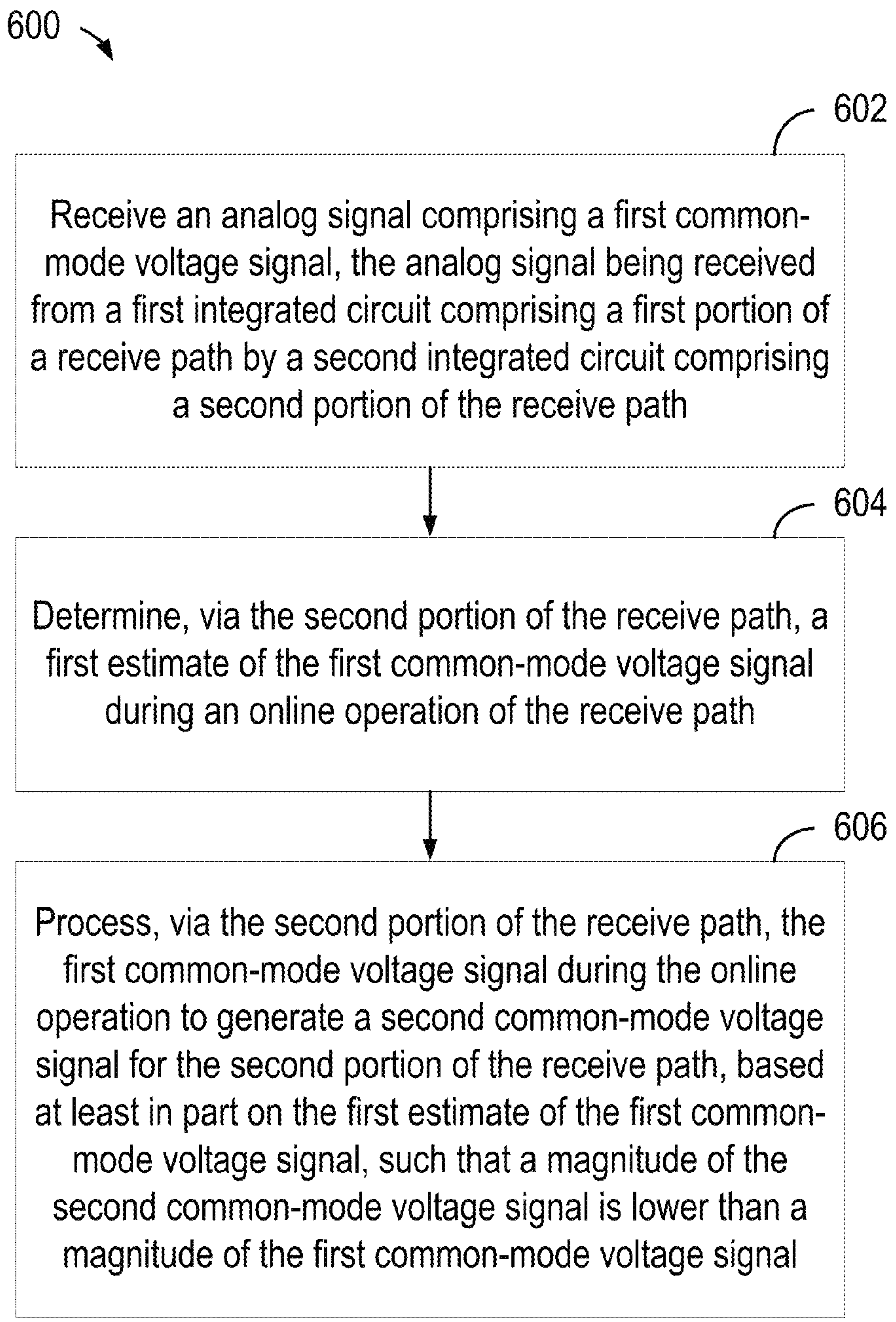
FIG. 6 is a flow diagram illustrating example operations for wireless communications, in accordance with certain aspects of the present disclosure.

FIG. 6 is a flow diagram illustrating example operations 600 for wireless communication, in accordance with certain aspects of the present disclosure. The operations 600 may be performed, for example, by a circuit for wireless communications, such as a receiver or a transceiver (e.g., the RF transceiver circuit 300 of FIG. 3).

At block 602, the circuit receives an analog signal including a first common-mode voltage signal. The analog signal is received from a first integrated circuit including a first portion of a receive path by a second integrated circuit including a second portion of the receive path.

At block 604, the circuit determines, via the second portion of the receive path, a first estimate of the first common-mode voltage signal during an online operation of the receive path.

At block 606, the circuit processes, via the second portion of the receive path, the first common-mode voltage signal during the online operation to generate a second common-mode voltage signal for the second portion of the receive path (e.g., common-mode voltage signal output from combiner circuit 452), based at least in part on the first estimate of the first common-mode voltage signal. This processing may be performed such that a magnitude of the second common-mode voltage signal is lower than a magnitude of the first common-mode voltage signal.

In certain aspects, determining the first estimate of the first common-mode voltage signal includes: (i) obtaining, over a time window during the online operation, a plurality of samples of a common-mode voltage difference between the first integrated circuit and the second integrated circuit; (ii) determining a filtered value of the common-mode voltage difference over the time window, based on performing a filtering operation with the plurality of samples; and (iii) determining the first estimate of the first common-mode voltage signal based on the filtered value of the common-mode voltage difference and a second estimate of the first common-mode voltage signal.

In such aspects, processing the first common-mode voltage signal to generate the second common-mode voltage signal may include applying the first estimate of the first common-mode voltage signal to the first common-mode voltage signal. In such aspects, applying the first estimate of the first common-mode voltage signal to the first common-mode voltage signal may include subtracting the first estimate of the first common-mode voltage signal from the first common-mode voltage signal. Additionally or alternatively, in such aspects, the first estimate of the first common-mode voltage signal may be applied to the first common-mode voltage signal when the filtered value of the common-mode voltage difference is greater than (or equal to) a threshold.

Example Aspects

In addition to the various aspects described above, specific combinations of aspects are within the scope of the present disclosure, some of which are detailed below:

Aspect 1: A circuit for wireless communications comprising: a first integrated circuit comprising: a first output; and a first portion of a first receive path, the first portion being configured to generate a first analog signal comprising a first common-mode voltage signal and to provide the first analog signal to the first output; and a second integrated circuit comprising: a first input coupled to the first output and configured to receive the first analog signal from the first output; and a second portion of the first receive path, the second portion being configured to: receive the first analog signal comprising the first common-mode voltage signal from the first input; determine a first estimate of the first common-mode voltage signal during an online operation of the first receive path; and process the first common-mode voltage signal during the online operation to generate a second common-mode voltage signal for the second portion of the first receive path, based at least in part on the first estimate of the first common-mode voltage signal.

Aspect 2: The circuit for wireless communications of Aspect 1, wherein to determine the first estimate of the first common-mode voltage signal, the second portion is configured to: obtain, over a first time window during the online operation, a plurality of samples of a common-mode voltage difference between the first integrated circuit and the second integrated circuit; determine a filtered value of the common-mode voltage difference over the first time window, based on performing a filtering operation with the plurality of samples; and determine the first estimate of the first common-mode voltage signal based on the filtered value of the common-mode voltage difference and a second estimate of the first common-mode voltage signal.

Aspect 3: The circuit for wireless communications of Aspect 2, wherein the second estimate of the first common-mode voltage signal is a prior estimate of the first common-mode voltage signal determined during a second time window, prior to the first time window, during the online operation.

Aspect 4: The circuit for wireless communications of Aspect 2, wherein the second estimate of the first common-mode voltage signal is a preconfigured estimate of the first common-mode voltage signal.

Aspect 5: The circuit for wireless communications according to any of Aspects 2-5, wherein to process the first common-mode voltage signal to generate the second common-mode voltage signal, the second portion of the first receive path is configured to apply the first estimate of the first common-mode voltage signal to the first common-mode voltage signal.

Aspect 6: The circuit for wireless communications of Aspect 5, wherein to apply the first estimate of the first common-mode voltage signal to the first common-mode voltage signal, the second portion of the first receive path is configured to subtract the first estimate of the first common-mode voltage signal from the first common-mode voltage signal.

Aspect 7: The circuit for wireless communications according to any of Aspects 2-6, wherein to process the first common-mode voltage signal to generate the second common-mode voltage signal, the second portion of the first receive path is configured to apply the first estimate of the first common-mode voltage signal to the first common-mode voltage signal when the filtered value of the common-mode voltage difference is greater than or equal to a threshold.

Aspect 8: The circuit for wireless communications according to any of Aspects 1-7, wherein: the second portion of the first receive path comprises an analog-to-digital converter (ADC); and to process the first common-mode voltage signal, the second portion of the first receive path is configured to process the first common-mode voltage signal prior to the ADC receiving the second common-mode voltage signal as an input.

Aspect 9: The circuit for wireless communications according to any of Aspects 1-8, wherein the first integrated circuit further comprises a second output coupled to a reference potential node, the first analog signal being referenced to the reference potential node.

Aspect 10: The circuit for wireless communications according to any of Aspects 1-9, wherein the first analog signal comprises a quadrature analog signal or an in-phase analog signal.

Aspect 11: The circuit for wireless communications according to any of Aspects 1-9, wherein: the first integrated circuit further comprises: a third output; and a first portion of a second receive path configured to generate a second analog signal comprising a third common-mode voltage signal and to provide the second analog signal to the third output; and the second integrated circuit further comprises: a second input coupled to the third output and configured to receive the second analog signal from the third output; and a second portion of the second receive path configured to: receive the second analog signal comprising the third common-mode voltage signal from the second input; determine an estimate of the third common-mode voltage signal during the online operation of the second receive path; and process the third common-mode voltage signal during the online operation of the second receive path to generate a fourth common-mode voltage signal for the second portion of the second receive path, based at least in part on the estimate of the third common-mode voltage signal, such that a magnitude of the fourth common-mode voltage signal is lower than a magnitude of the third common-mode voltage signal.

Aspect 12: The circuit for wireless communications of Aspect 11, wherein the first integrated circuit further comprises a fourth output coupled to the reference potential node, the second analog signal being referenced to the reference potential node.

Aspect 13: The circuit for wireless communications according to any of Aspects 11-12, wherein: the first analog signal comprises an in-phase analog signal; and the second analog signal comprises a quadrature analog signal.

Aspect 14: The circuit for wireless communications according to any of Aspects 1-13, wherein: the first portion of the first receive path comprises a baseband filter; and the second portion of the first receive path comprises an analog-to-digital converter.

Aspect 15: The circuit for wireless communications according to any of Aspects 1-14, wherein the second common-mode voltage signal is generated such that a magnitude of the second common-mode voltage signal is lower than a magnitude of the first common-mode voltage signal.

Aspect 16: A method of common-mode voltage adjustment for a single-ended analog interface in a wireless device, the method comprising: receiving an analog signal comprising a first common-mode voltage signal, the analog signal being received from a first integrated circuit comprising a first portion of a receive path by a second integrated circuit comprising a second portion of the receive path; determining, via the second portion of the receive path, a first estimate of the first common-mode voltage signal during an online operation of the receive path; and processing, via the second portion of the receive path, the first common-mode voltage signal during the online operation to generate a second common-mode voltage signal for the second portion of the receive path, based at least in part on the first estimate of the first common-mode voltage signal.

Aspect 17: The method of Aspect 16, wherein determining the first estimate of the first common-mode voltage signal comprises: obtaining, over a time window during the online operation, a plurality of samples of a common-mode voltage difference between the first integrated circuit and the second integrated circuit; determining a filtered value of the common-mode voltage difference over the time window, based on performing a filtering operation with the plurality of samples; and determining the first estimate of the first common-mode voltage signal based on the filtered value of the common-mode voltage difference and a second estimate of the first common-mode voltage signal.

Aspect 18: The method according to any of Aspects 16-17, wherein processing the first common-mode voltage signal to generate the second common-mode voltage signal comprises applying the first estimate of the first common-mode voltage signal to the first common-mode voltage signal.

Aspect 19: The method of Aspect 18, wherein applying the first estimate of the first common-mode voltage signal to the first common-mode voltage signal comprises subtracting the first estimate of the first common-mode voltage signal from the first common-mode voltage signal.

Aspect 20: The method according to any of Aspects 17-19, wherein the first estimate of the first common-mode voltage signal is applied to the first common-mode voltage signal when the filtered value of the common-mode voltage difference is greater than or equal to a threshold.

Aspect 21: The method according to any of Aspects 16-20, wherein the second common-mode voltage signal is generated such that a magnitude of the second common-mode voltage signal is lower than a magnitude of the first common-mode voltage signal.

Aspect 22: A wireless device comprising: at least one antenna; and a circuit for wireless communications coupled to the at least one antenna, the circuit comprising: a first integrated circuit comprising a first portion of a receive path, the first portion being configured to generate an analog signal comprising a first common-mode voltage signal and to provide the analog signal to an output of the first integrated circuit; and a second integrated circuit comprising: an input coupled to the output of the first integrated circuit and configured to receive the analog signal from the output; and a second portion of the receive path, the second portion being configured to: receive the analog signal comprising the first common-mode voltage signal from the input; determine an estimate of the first common-mode voltage signal during an online operation of the receive path; and process the first common-mode voltage signal during the online operation to generate a second common-mode voltage signal for the second portion of the receive path, based at least in part on the estimate of the first common-mode voltage signal.

Aspect 23: The wireless device of Aspect 22, wherein the second common-mode voltage signal is generated such that a magnitude of the second common-mode voltage signal is lower than a magnitude of the first common-mode voltage signal.

Additional Considerations

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components. Means for generating an analog signal comprising a common-mode voltage signal may include, for example, an LNA (e.g., LNA 324) and/or a BBF (e.g., BBF 328). Means for receiving an analog signal comprising a common-mode voltage signal may include, for example, a modem IC (e.g., modem IC 420B) and/or a portion (e.g., portion 450, portion 470) of a receive path (e.g., RX path 304) implemented on the modem IC (e.g., modem IC 420B). Means for determining an estimate of a common-mode voltage signal during online operation of a receive path may include, for example, one or more processors (e.g., controller 336, processor 240, controller/processor 280, controller/processor 240) and/or control logic (e.g., adjustment logic 460). Means for processing a common-mode voltage signal during online operation to generate another common-mode voltage signal may include, for example, one or more processors (e.g., controller 336, processor 240, controller/processor 280, controller/processor 240), voltage generator (e.g., Vcm generator 456), filter (e.g., filter 454), and/or a combiner circuit (e.g., combiner circuit 452). Means for obtaining samples of a common-mode voltage difference may include, for example, one or more processors (e.g., controller 336, processor 240, controller/processor 280, controller/processor 240) and/or control logic (e.g., adjustment logic 460). Means for determining a filtered value of a common-mode voltage difference may include, for example, one or more processors (e.g., controller 336, processor 240, controller/processor 280, controller/processor 240) and/or control logic (e.g., adjustment logic 460). Means for applying an estimate of a common-mode voltage signal to a common-mode voltage signal may include, for example, one or more processors (e.g., controller 336, processor 240, controller/processor 280, controller/processor 240), voltage generator (e.g., Vcm generator 456), filter (e.g., filter 454), and/or a combiner circuit (e.g., combiner circuit 452). Means for subtracting an estimate of a common-mode voltage signal to a common-mode voltage signal may include, for example, a combiner circuit (e.g., combiner circuit 452). Means for converting an analog signal include a common-mode voltage signal to a digital signal may include, for example, an ADC (e.g., ADC 458, ADC 330).

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A circuit for wireless communications comprising:

a first integrated circuit comprising:

a first output; and a first portion of a first receive path, the first portion being configured to generate a first analog signal comprising a first common-mode voltage signal and to provide the first analog signal to the first output; and a second integrated circuit comprising:

a first input coupled to the first output and configured to receive the first analog signal from the first output; and a second portion of the first receive path, the second portion being configured to:

receive the first analog signal comprising the first common-mode voltage signal from the first input;

determine a first estimate of the first common-mode voltage signal based on a filtered value of a common-mode voltage difference between the first integrated circuit and the second integrated circuit during an online operation of the first receive path; and process the first common-mode voltage signal during the online operation to generate a second common-mode voltage signal for the second portion of the first receive path, based at least in part on the first estimate of the first common-mode voltage signal.

2. The circuit for wireless communications of claim 1, wherein to determine the first estimate of the first common-mode voltage signal, the second portion is configured to:

obtain, over a first time window during the online operation, a plurality of samples of the common-mode voltage difference between the first integrated circuit and the second integrated circuit;

determine the filtered value of the common-mode voltage difference over the first time window, based on performing a filtering operation with the plurality of samples; and determine the first estimate of the first common-mode voltage signal based on (i) the filtered value of the common-mode voltage difference and (ii) a second estimate of the first common-mode voltage signal.

3. The circuit for wireless communications of claim 2, wherein the second estimate of the first common-mode voltage signal is a prior estimate of the first common-mode voltage signal determined during a second time window, prior to the first time window, during the online operation.

4. The circuit for wireless communications of claim 2, wherein the second estimate of the first common-mode voltage signal is a preconfigured estimate of the first common-mode voltage signal.

5. The circuit for wireless communications of claim 2, wherein to process the first common-mode voltage signal to generate the second common-mode voltage signal, the second portion of the first receive path is configured to apply the first estimate of the first common-mode voltage signal to the first common-mode voltage signal.

6. The circuit for wireless communications of claim 5, wherein to apply the first estimate of the first common-mode voltage signal to the first common-mode voltage signal, the second portion of the first receive path is configured to subtract the first estimate of the first common-mode voltage signal from the first common-mode voltage signal.

7. The circuit for wireless communications of claim 5, wherein to process the first common-mode voltage signal to generate the second common-mode voltage signal, the second portion of the first receive path is configured to apply the first estimate of the first common-mode voltage signal to the first common-mode voltage signal when the filtered value of the common-mode voltage difference is greater than or equal to a threshold.

8. The circuit for wireless communications of claim 1, wherein:

the second portion of the first receive path comprises an analog-to-digital converter (ADC); and to process the first common-mode voltage signal, the second portion of the first receive path is configured to process the first common-mode voltage signal prior to the ADC receiving the second common-mode voltage signal as an input.

9. The circuit for wireless communications of claim 1, wherein the first integrated circuit further comprises a second output coupled to a reference potential node, the first analog signal being referenced to the reference potential node.

10. The circuit for wireless communications of claim 9, wherein the first analog signal comprises a quadrature analog signal or an in-phase analog signal.

11. The circuit for wireless communications of claim 9, wherein:

the first integrated circuit further comprises:

a third output; and a first portion of a second receive path configured to generate a second analog signal comprising a third common-mode voltage signal and to provide the second analog signal to the third output; and the second integrated circuit further comprises:

a second input coupled to the third output and configured to receive the second analog signal from the third output; and a second portion of the second receive path configured to:

receive the second analog signal comprising the third common-mode voltage signal from the second input;

determine an estimate of the third common-mode voltage signal during the online operation of the second receive path; and process the third common-mode voltage signal during the online operation of the second receive path to generate a fourth common-mode voltage signal for the second portion of the second receive path, based at least in part on the estimate of the third common-mode voltage signal, such that a magnitude of the fourth common-mode voltage signal is lower than a magnitude of the third common-mode voltage signal.

12. The circuit for wireless communications of claim 11, wherein the first integrated circuit further comprises a fourth output coupled to the reference potential node, the second analog signal being referenced to the reference potential node.

13. The circuit for wireless communications of claim 12, wherein:

the first analog signal comprises an in-phase analog signal; and the second analog signal comprises a quadrature analog signal.

14. The circuit for wireless communications of claim 1, wherein:

the first portion of the first receive path comprises a baseband filter; and the second portion of the first receive path comprises an analog-to-digital converter.

15. A method of common-mode voltage adjustment for a single-ended analog interface in a wireless device, the method comprising:

receiving an analog signal comprising a first common-mode voltage signal, the analog signal being received from a first integrated circuit comprising a first portion of a receive path by a second integrated circuit comprising a second portion of the receive path;

determining, via the second portion of the receive path, a first estimate of the first common-mode voltage signal based on a filtered value of a common-mode voltage difference between the first integrated circuit and the second integrated circuit during an online operation of the receive path; and processing, via the second portion of the receive path, the first common-mode voltage signal during the online operation to generate a second common-mode voltage signal for the second portion of the receive path, based at least in part on the first estimate of the first common-mode voltage signal.

16. The method of claim 15, wherein determining the first estimate of the first common-mode voltage signal comprises:

obtaining, over a time window during the online operation, a plurality of samples of the common-mode voltage difference between the first integrated circuit and the second integrated circuit;

determining the filtered value of the common-mode voltage difference over the time window, based on performing a filtering operation with the plurality of samples; and determining the first estimate of the first common-mode voltage signal based on (i) the filtered value of the common-mode voltage difference and (ii) a second estimate of the first common-mode voltage signal.

17. The method of claim 16, wherein processing the first common-mode voltage signal to generate the second common-mode voltage signal comprises applying the first estimate of the first common-mode voltage signal to the first common-mode voltage signal.

18. The method of claim 17, wherein applying the first estimate of the first common-mode voltage signal to the first common-mode voltage signal comprises subtracting the first estimate of the first common-mode voltage signal from the first common-mode voltage signal.

19. The method of claim 17, wherein the first estimate of the first common-mode voltage signal is applied to the first common-mode voltage signal when the filtered value of the common-mode voltage difference is greater than or equal to a threshold.

20. A wireless device comprising:

at least one antenna; and a circuit for wireless communications coupled to the at least one antenna, the circuit comprising:

a first integrated circuit comprising a first portion of a receive path, the first portion being configured to generate an analog signal comprising a first common-mode voltage signal and to provide the analog signal to an output of the first integrated circuit; and a second integrated circuit comprising:

an input coupled to the output of the first integrated circuit and configured to receive the analog signal from the output; and a second portion of the receive path, the second portion being configured to:

receive the analog signal comprising the first common-mode voltage signal from the input;

determine an estimate of the first common-mode voltage signal based on a filtered value of a common-mode voltage difference between the first integrated circuit and the second integrated circuit during an online operation of the receive path; and process the first common-mode voltage signal during the online operation to generate a second common-mode voltage signal for the second portion of the receive path, based at least in part on the estimate of the first common-mode voltage signal.

* * * * *